(12) United States Patent
Choi et al.

(10) Patent No.: US 9,312,218 B2
(45) Date of Patent: Apr. 12, 2016

(54) SEMICONDUCTOR DEVICE AND METHOD OF FORMING LEADFRAME WITH CONDUCTIVE BODIES FOR VERTICAL ELECTRICAL INTERCONNECT OF SEMICONDUCTOR DIE

(75) Inventors: DaeSik Choi, Seoul (KR); SooSan Park, Seoul (KR); HanGil Shin, Gyeonggi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 882 days.

(21) Appl. No.: 13/106,591

(22) Filed: May 12, 2011

(65) Prior Publication Data

US 2012/0286407 A1    Nov. 15, 2012

(51) Int. Cl.
| | |
|---|---|
| *H01L 23/495* | (2006.01) |
| *H01L 23/498* | (2006.01) |
| *H01L 21/48* | (2006.01) |
| *H01L 25/10* | (2006.01) |
| *H01L 23/00* | (2006.01) |

(52) U.S. Cl.
CPC ...... *H01L 23/49827* (2013.01); *H01L 21/4853* (2013.01); *H01L 23/49811* (2013.01); *H01L 24/97* (2013.01); *H01L 25/105* (2013.01); H01L 2224/16225 (2013.01); H01L 2224/32245 (2013.01); H01L 2224/48091 (2013.01); H01L 2224/73253 (2013.01); H01L 2224/73265 (2013.01); H01L 2224/97 (2013.01); H01L 2225/1023 (2013.01); H01L 2225/1058 (2013.01); H01L 2225/1094 (2013.01); H01L 2924/01322 (2013.01); H01L 2924/12041 (2013.01); H01L 2924/1306 (2013.01); H01L 2924/13091 (2013.01); H01L 2924/15311 (2013.01); H01L 2924/18161 (2013.01); H01L 2924/3025 (2013.01); H01L 2924/3511 (2013.01)

(58) Field of Classification Search
CPC ............. H01L 23/49827; H01L 24/97; H01L 21/4853; H01L 23/49811
USPC .................. 438/122, 123, 124; 257/E23.051
See application file for complete search history.

(56) References Cited

U.S. PATENT DOCUMENTS

| | | | |
|---|---|---|---|
| 6,818,973 B1 * | 11/2004 | Foster ........................... | 257/676 |
| 2005/0046012 A1 * | 3/2005 | Ramakrishna et al. ........ | 257/706 |
| 2009/0085185 A1 * | 4/2009 | Byun et al. .................... | 257/686 |
| 2010/0133665 A1 | 6/2010 | Ha et al. | |
| 2011/0140259 A1 | 6/2011 | Cho et al. | |
| 2011/0233747 A1 | 9/2011 | Lee et al. | |
| 2012/0049334 A1 * | 3/2012 | Pagaila et al. ................. | 257/666 |

* cited by examiner

*Primary Examiner* — John P Dulka
(74) *Attorney, Agent, or Firm* — Robert D. Atkins; Atkins and Associates, P.C.

(57) ABSTRACT

A semiconductor device has a semiconductor die mounted to a substrate. A leadframe has a base plate and integrated tie bars and conductive bodies. The tie bars include a down step with an angled surface and horizontal surface between the conductive bodies. The leadframe is mounted to the semiconductor die and substrate with the base plate disposed on a back surface of the semiconductor die and the conductive bodies disposed around the semiconductor die and electrically connected to the substrate. An encapsulant is deposited over the substrate and semiconductor die and into the down step of the tie bars. A conductive layer is formed over the conductive bodies to inhibit oxidation. The leadframe is singulated through the encapsulant in the down step and through the horizontal portion of the tie bars to electrically isolate the conductive bodies. A semiconductor package can be mounted to the substrate and semiconductor die.

20 Claims, 20 Drawing Sheets

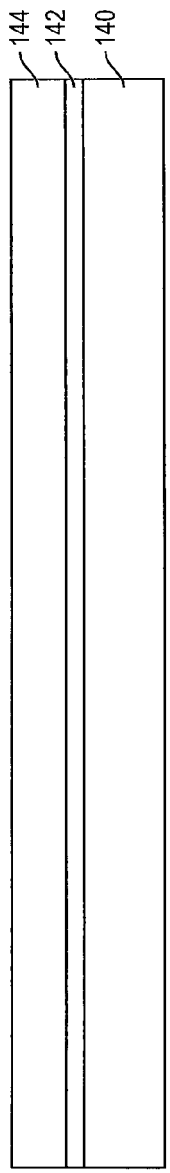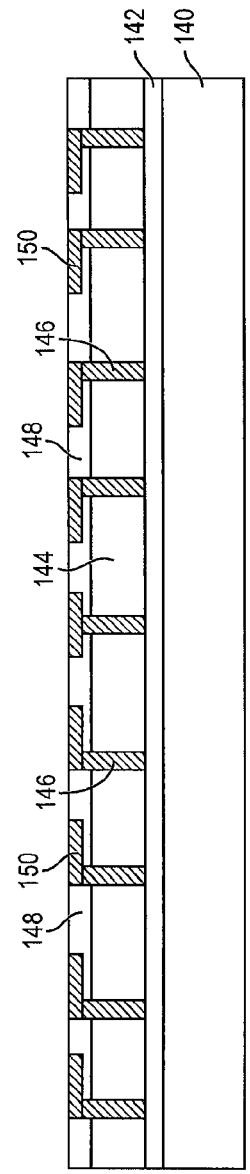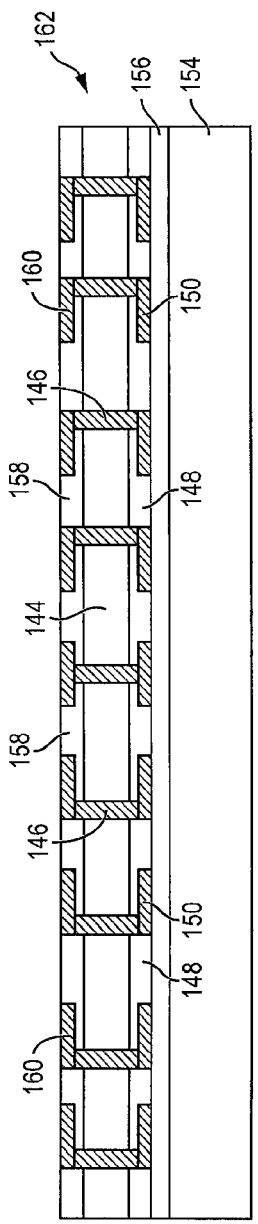

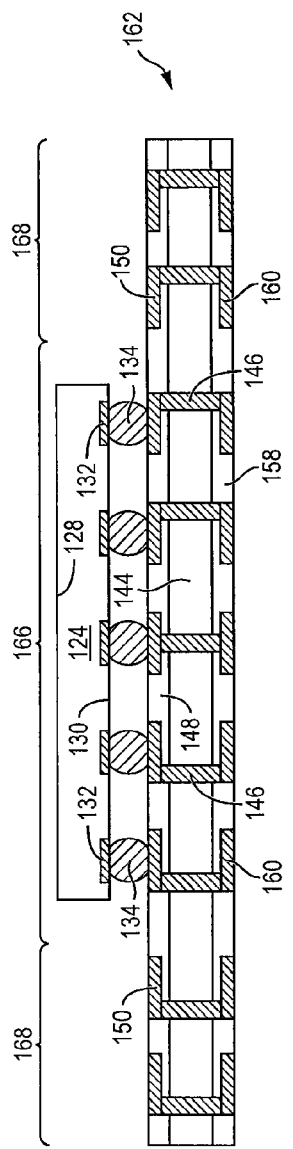
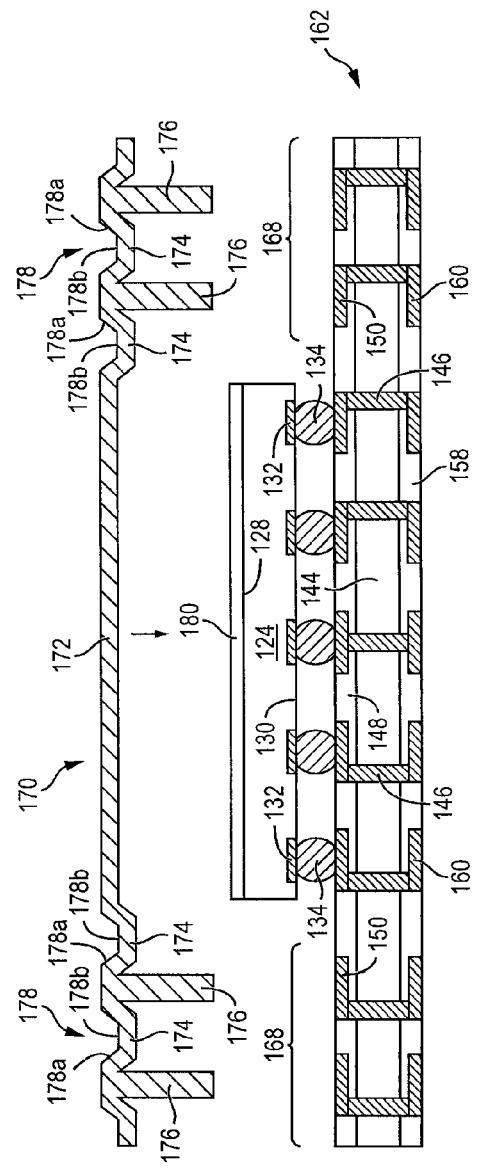
FIG. 4f
FIG. 4g

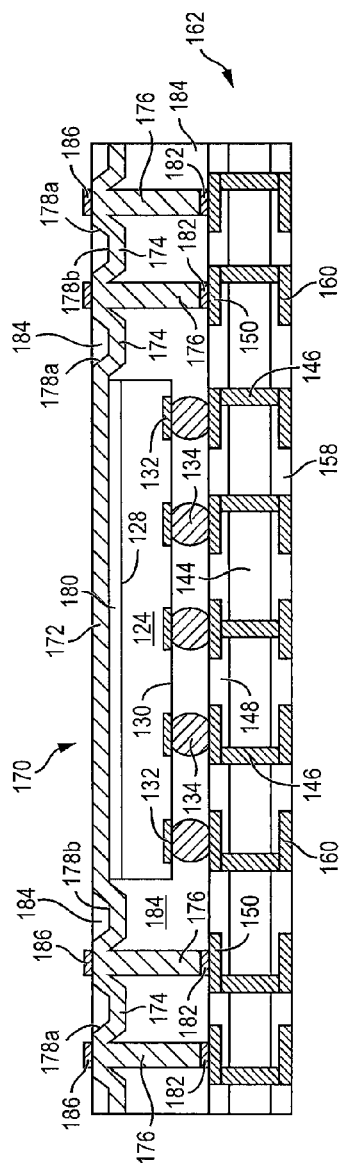
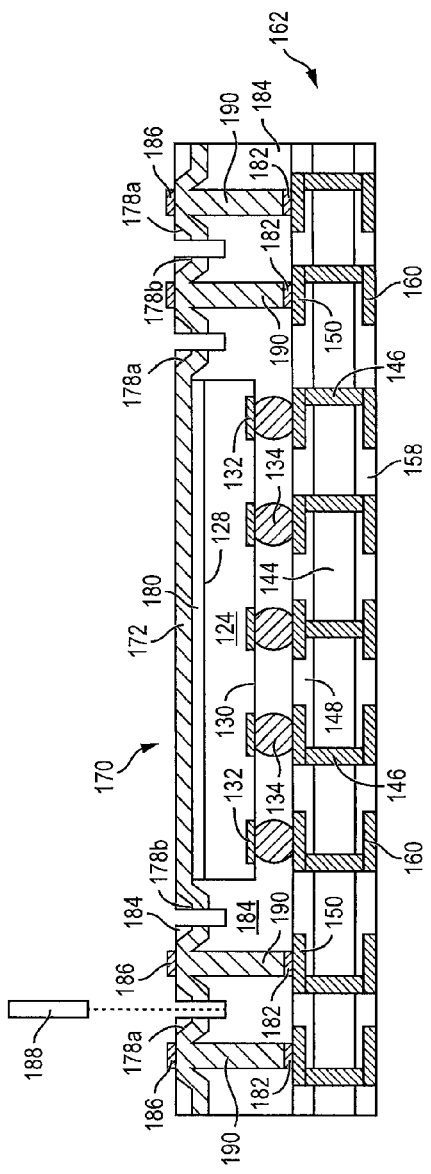
FIG. 4l
FIG. 4m

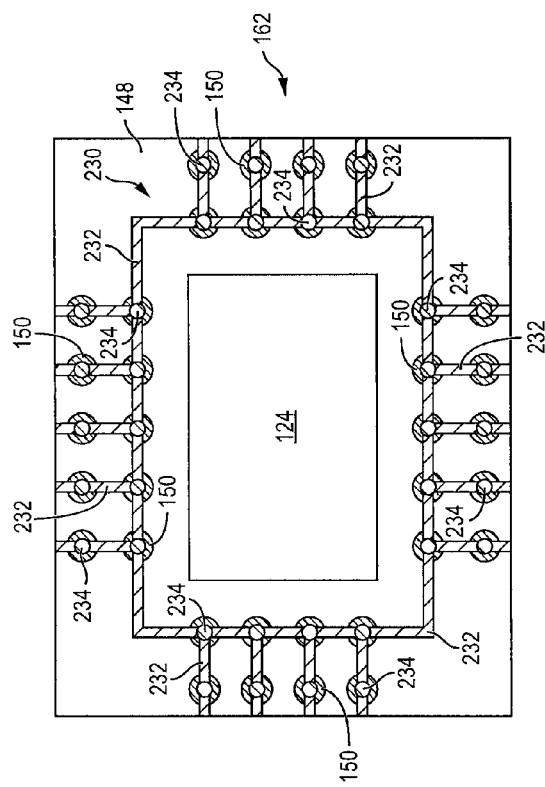
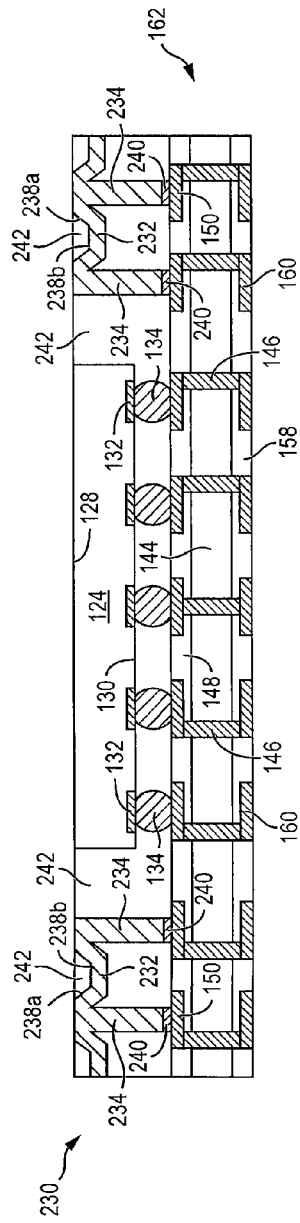
FIG. 6c
FIG. 6d

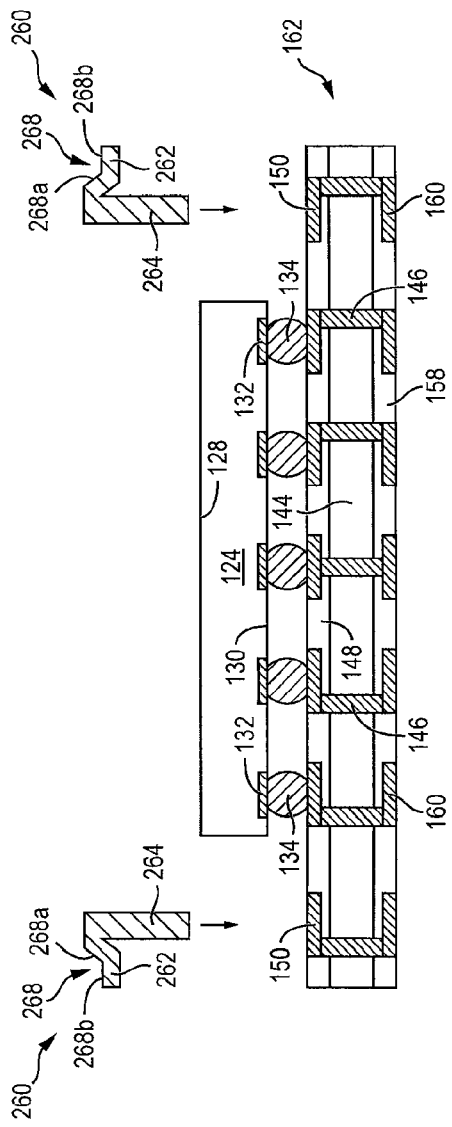
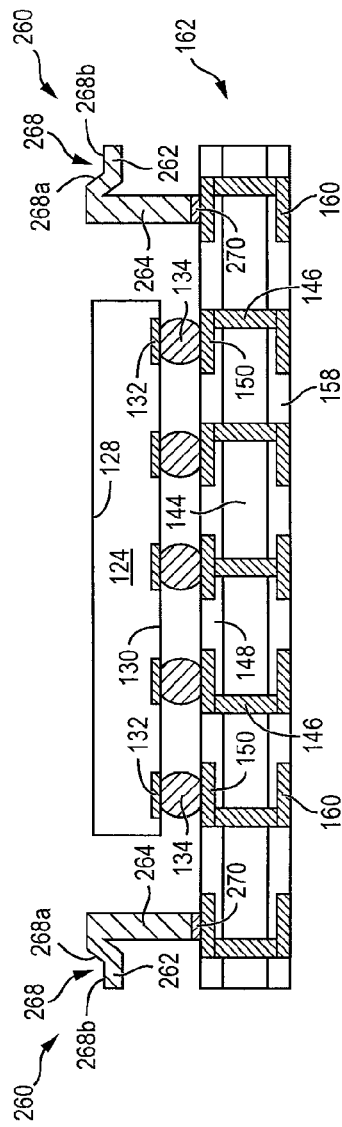
FIG. 7a
FIG. 7b

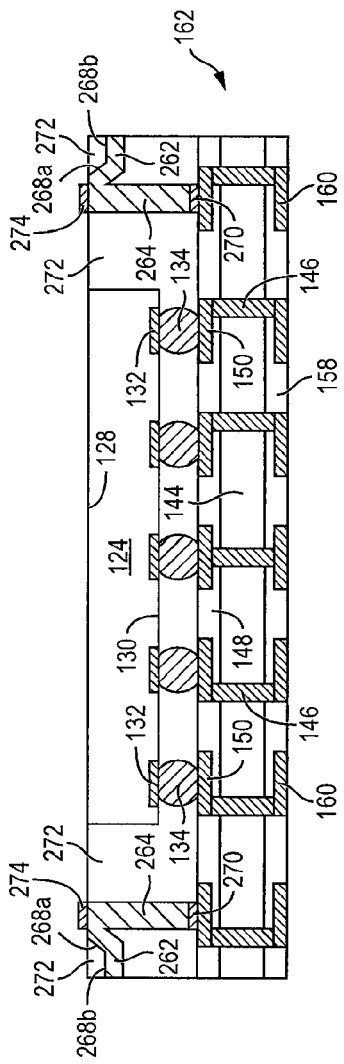
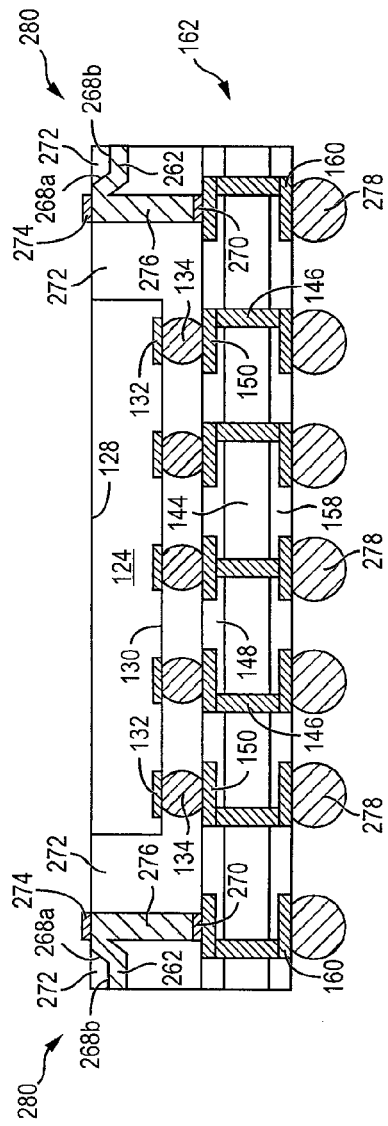

SEMICONDUCTOR DEVICE AND METHOD OF FORMING LEADFRAME WITH CONDUCTIVE BODIES FOR VERTICAL ELECTRICAL INTERCONNECT OF SEMICONDUCTOR DIE

FIELD OF THE INVENTION

The present invention relates in general to semiconductor devices and, more particularly, to a semiconductor device and method of forming a leadframe with conductive bodies for vertical electrical interconnect of a semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional fan-out wafer level chip scale package (Fo-WLCSP) may contain a semiconductor die with bumps formed over contact pads on an active surface of the die. The semiconductor die is mounted to a substrate and covered with an encapsulant. Conductive vias are formed through the encapsulant around the substrate for vertical electrical interconnect. However, the formation of conductive vias may involve a time-consuming plating process and is susceptible to voids and other defects.

In another conventional Fo-WLCSP, a leadframe is mounted over a semiconductor and substrate. The leadframe has vertical conductive bodies that are disposed over the substrate and around the semiconductor die. An encapsulant is deposited around the semiconductor die and conductive bodies. When the leadframe is singulated, the conductive bodies are electrically isolated as conductive vias within the encapsulant for vertical interconnect. Warpage is a principal concern for the Fo-WLCSP, as well as defects from electrical shorts.

SUMMARY OF THE INVENTION

A need exists for a leadframe with conductive bodies for vertical electrical interconnect of a semiconductor die. Accordingly, in one embodiment, the present invention is a method of making a semiconductor device comprising the steps of providing a first substrate, mounting a first semiconductor die to the first substrate, and providing a leadframe having a base plate and integrated tie bars and conductive bodies. The tie bars include a down step with an angled surface and horizontal surface between the conductive bodies. The method further includes the steps of mounting the leadframe to the first semiconductor die and first substrate with the base plate disposed on a back surface of the first semiconductor die and the conductive bodies disposed around the first semiconductor die and electrically connected to the first substrate, depositing an encapsulant over the first substrate and around the first semiconductor die and into the down step of the tie bars, and singulating the leadframe through the encapsulant in the down step and through the horizontal portion of the tie bars to electrically isolate the conductive bodies.

In another embodiment, the present invention is a method of making a semiconductor device comprising the steps of providing a first substrate, mounting a first semiconductor die to the first substrate, and providing a leadframe having integrated tie bars and conductive bodies. The tie bars include a down step between the conductive bodies. The method further includes the steps of mounting the leadframe to the first semiconductor die and first substrate with the conductive bodies disposed around the first semiconductor die, depositing an encapsulant over the first substrate and around the first semiconductor die and into the down step of the tie bars, and singulating the leadframe through the encapsulant in the down step and through the tie bars to electrically isolate the conductive bodies.

In another embodiment, the present invention is a method of making a semiconductor device comprising the steps of providing a first semiconductor die, and providing a leadframe having integrated tie bars and conductive bodies. The tie bars include a down step between the conductive bodies. The method further includes the steps of mounting the leadframe over the first semiconductor die with the conductive bodies disposed around the first semiconductor die, depositing an encapsulant over the first semiconductor die and into the down step of the tie bars, and singulating the leadframe through the encapsulant in the down step and through the tie bars to electrically isolate the conductive bodies.

In another embodiment, the present invention is a semiconductor device comprising a first substrate and first semiconductor die mounted to the first substrate. A leadframe has integrated tie bars and conductive bodies. The tie bars include a down step between the conductive bodies. The leadframe is mounted to the first semiconductor die and first substrate with the conductive bodies disposed around the first semiconductor die. An encapsulant is deposited over the first substrate and around the first semiconductor die and into the down step of the tie bars. The leadframe is singulated through the encapsulant in the down step and through the tie bars to electrically isolate the conductive bodies.

BRIEF DESCRIPTION OF THE DRAWINGS

FIGS. 6a-6g illustrate a process of forming a leadframe with multiple rows of conductive bodies for vertical electrical interconnect of a semiconductor die; and FIGS. 7a-7f illustrate a process of forming a leadframe with a single row of conductive bodies for vertical electrical interconnect of a semiconductor die.

DETAILED DESCRIPTION OF THE DRAWINGS

Figure 1:
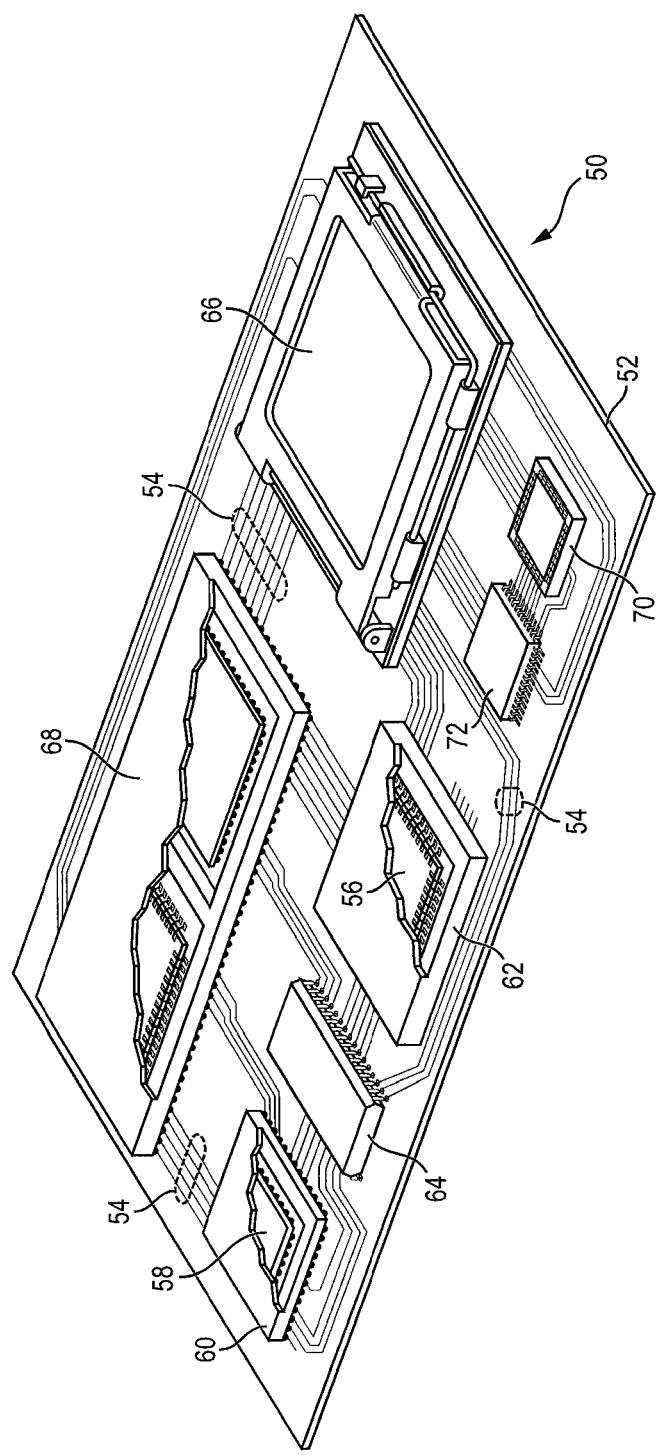
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package.

The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
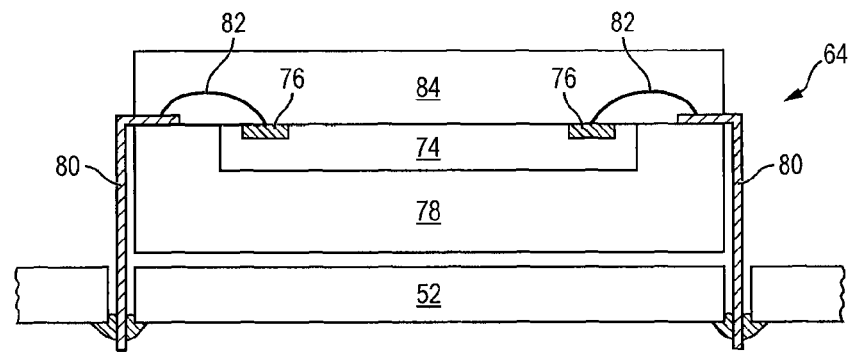
FIGS. 2a-2c illustrate further detail of the representative semiconductor packages mounted to the PCB.
Figure 2B:
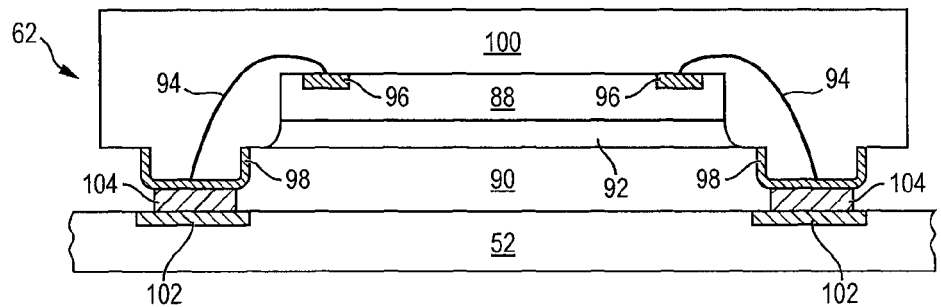
Figure 2C:
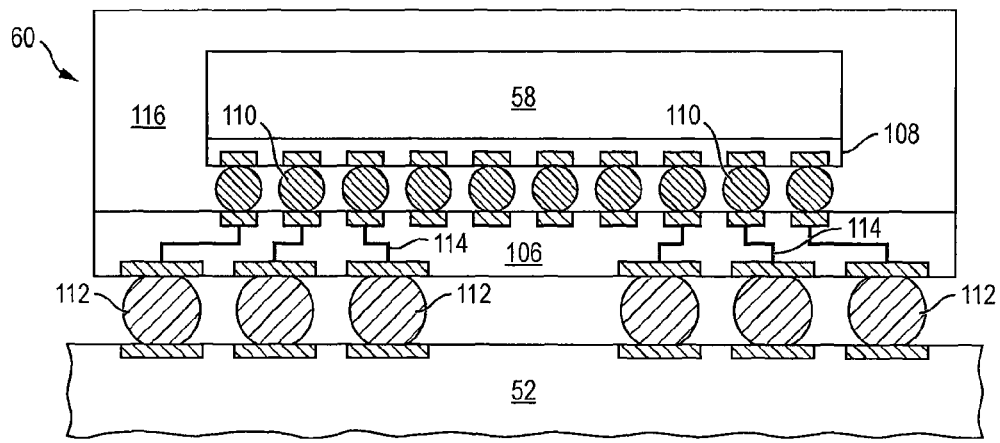

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
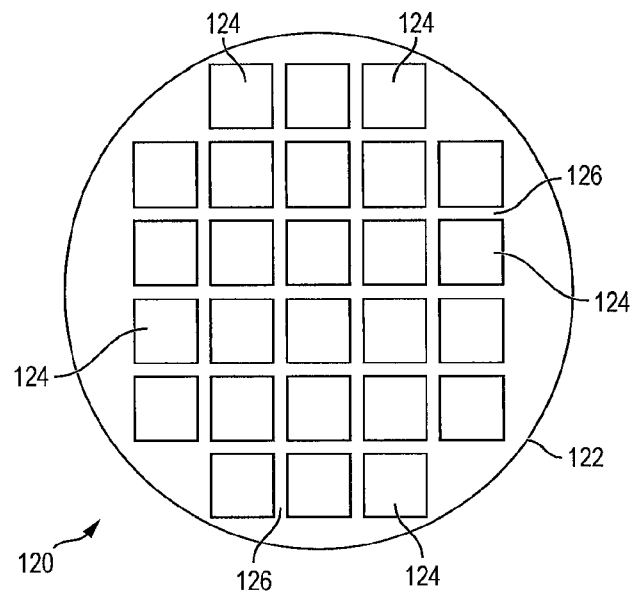
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
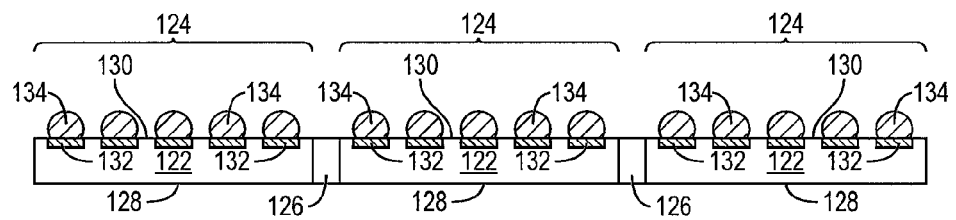

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

An electrically conductive bump material is deposited over contact pads 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form balls or bumps 134. In some applications, bumps 134 are reflowed a second time to improve electrical contact to contact pads 132. Bumps 134 can also be compression bonded to contact pads 132. Bumps 134 represent one type of interconnect structure that can be formed over contact pads 132. The interconnect structure can also use stud bump, micro bump, or other electrical interconnect.

Figure 3C:
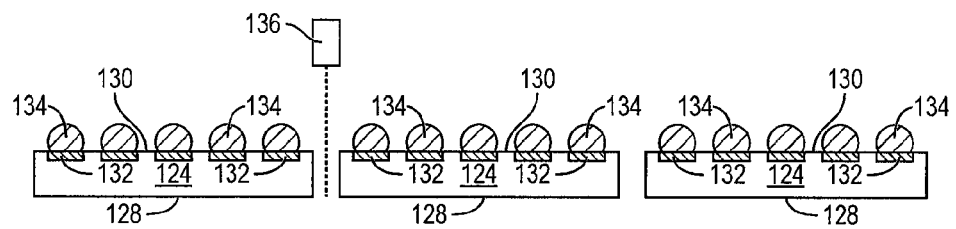

In FIG. 3c, semiconductor wafer 120 is singulated through saw street 126 using a saw blade or laser cutting tool 136 into individual semiconductor die 124.

Figure 4D:
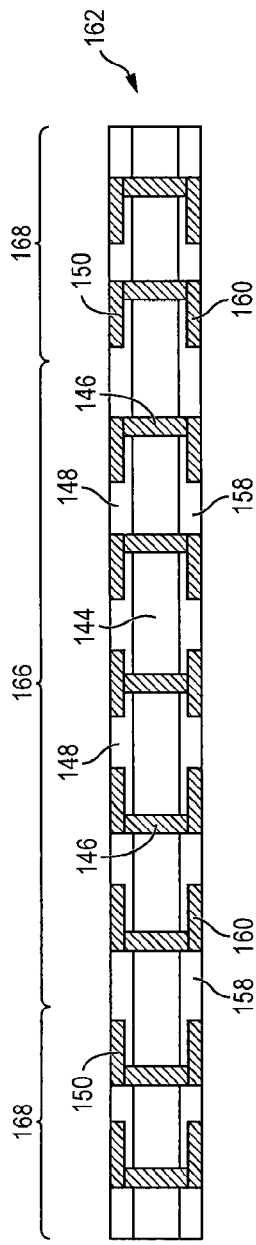
FIGS. 4a-4n illustrate a process of forming a leadframe with base plate and integrated tie bars and conductive bodies for vertical interconnect of a semiconductor die.
Figure 4E:
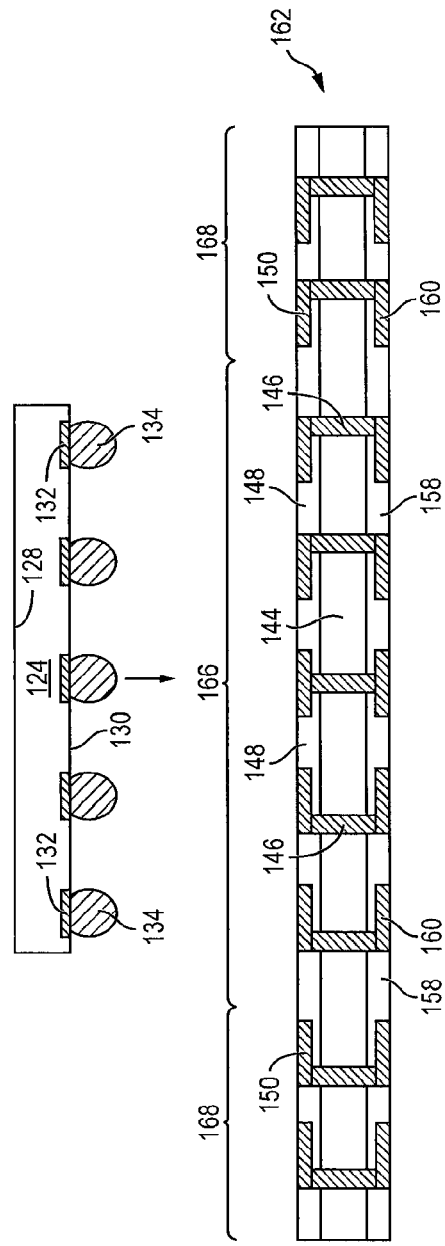
Figure 4H:
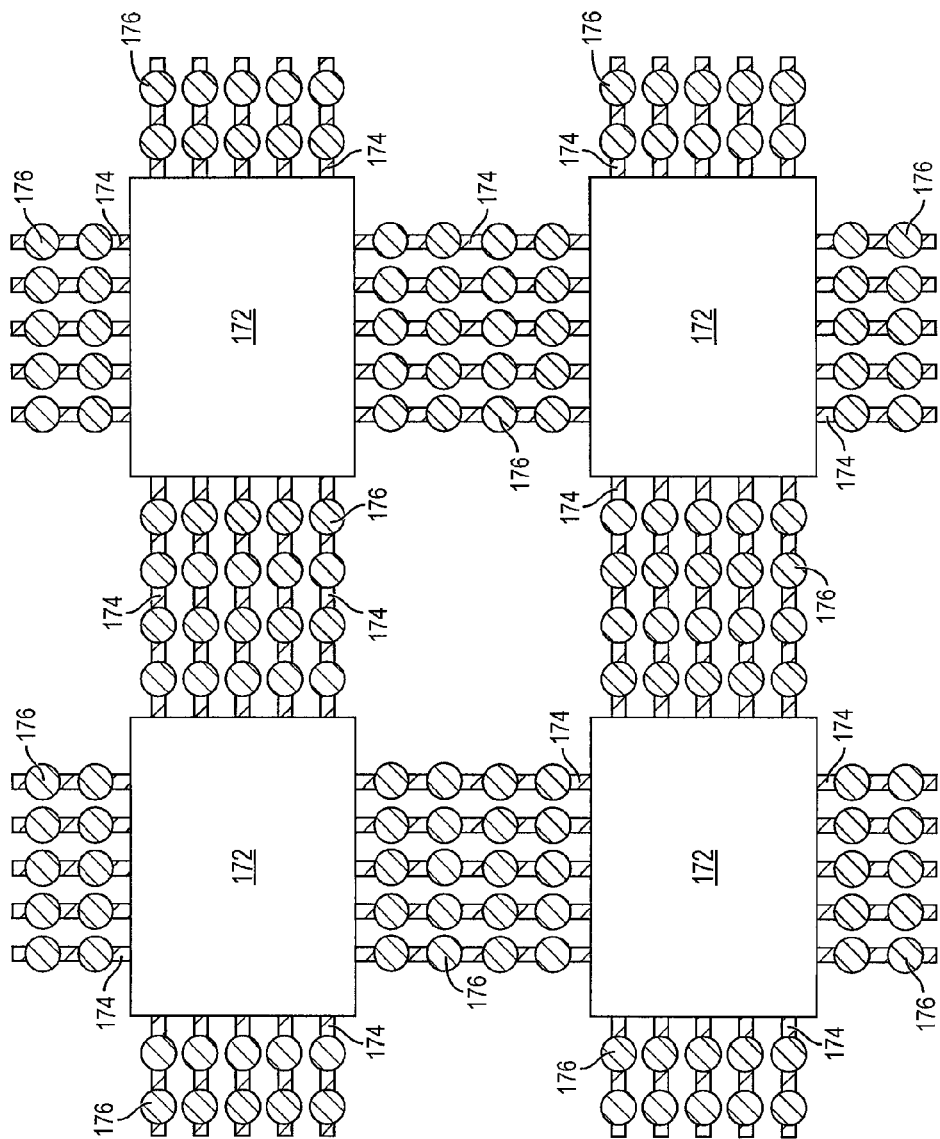
Figure 4I:
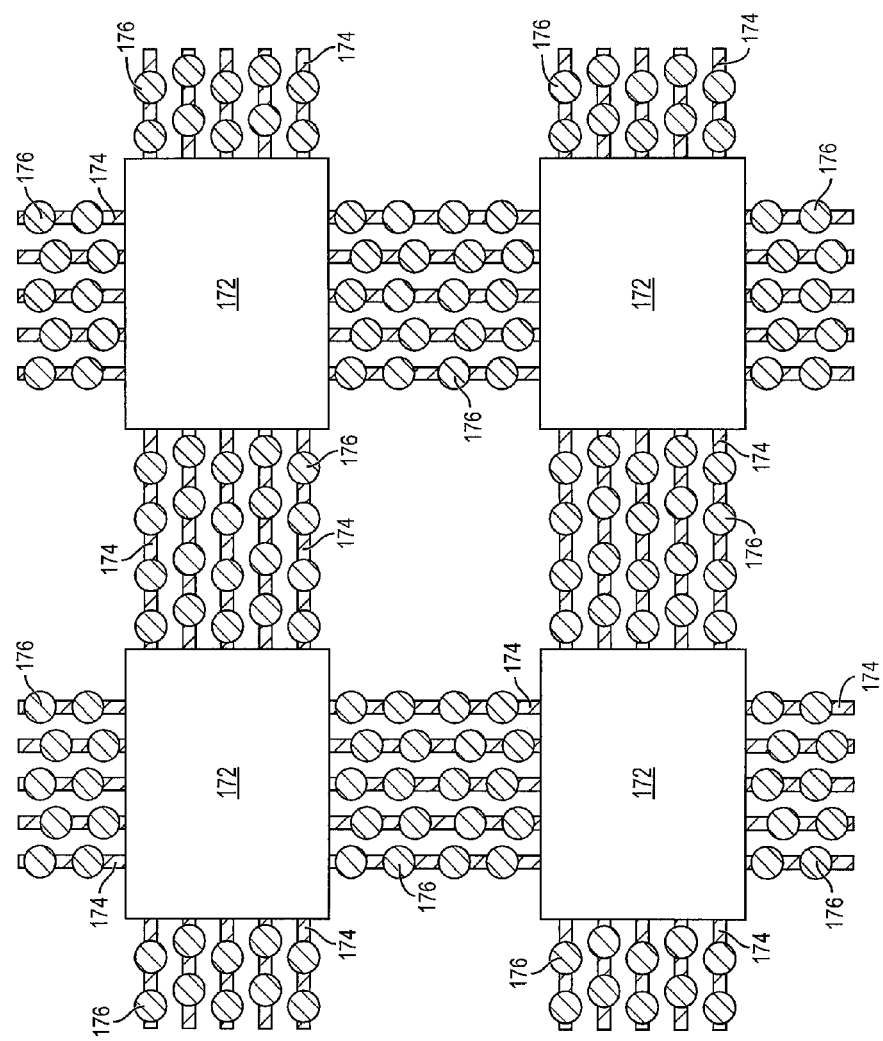
Figure 4J:
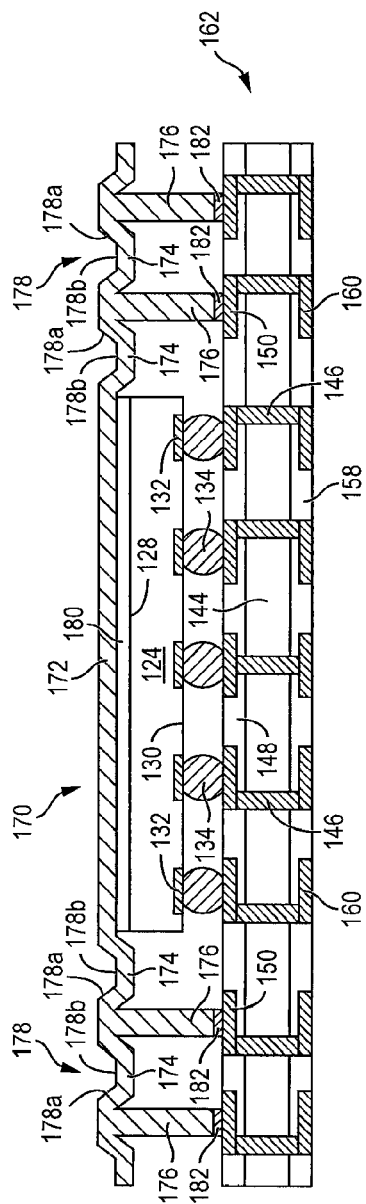
Figure 4K:
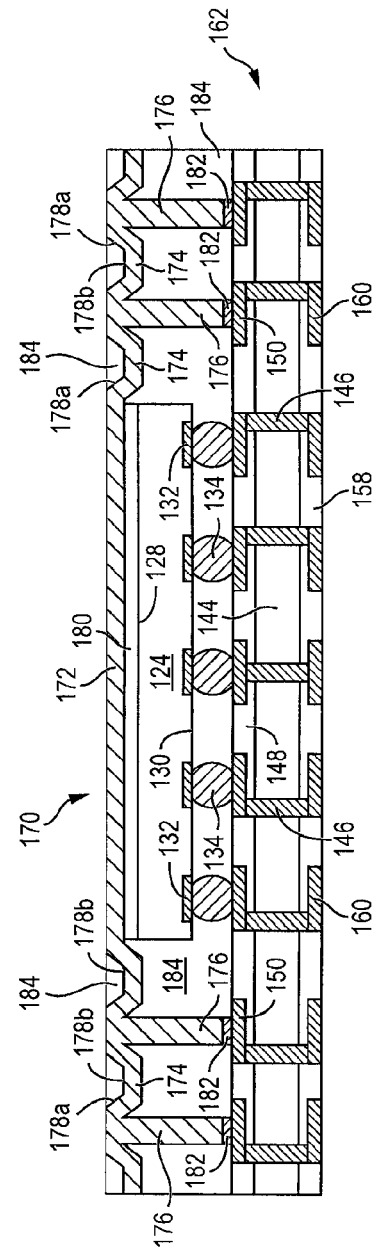
Figure 4N:
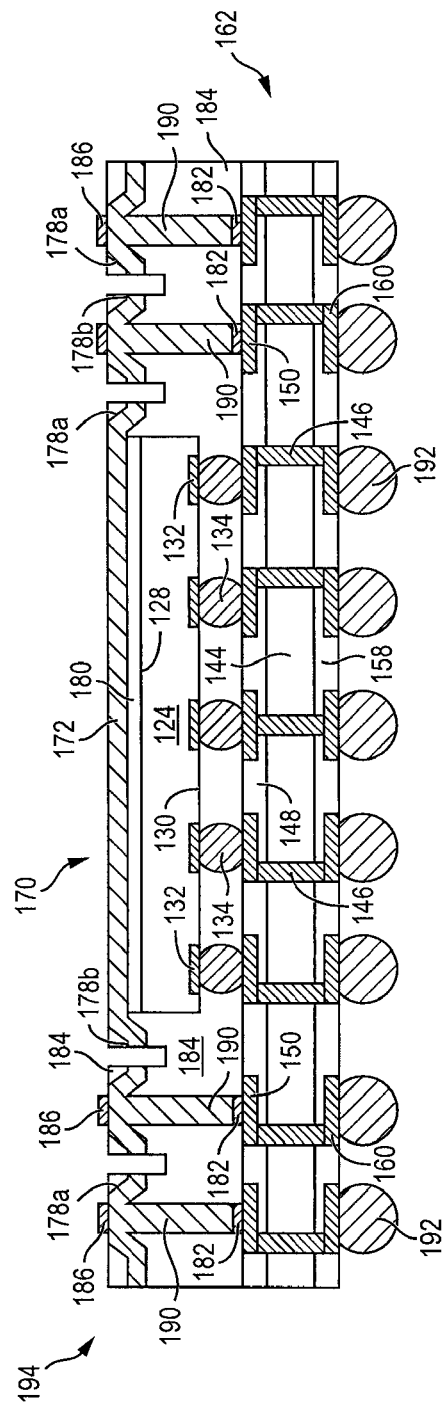

FIGS. 4a-4n illustrate, in relation to FIGS. 1 and 2a-2c, a process of forming a leadframe with a base plate and integrated tie bars and conductive bodies for vertical electrical interconnect of a semiconductor die. In FIG. 4a, a substrate or carrier 140 contains temporary or sacrificial base material such as silicon, germanium, gallium arsenide, indium phosphide, silicon carbide, resin, or other suitable low-cost, rigid material for structural support. An interface layer or double-sided tape 142 is formed over carrier 140 as a temporary adhesive bonding film or etch-stop layer. A semiconductor wafer or substrate 144 contains a base material, such as silicon, germanium, gallium arsenide, indium phosphide, or silicon carbide, for structural support. As a semiconductor wafer, substrate 144 can contain embedded semiconductor die or passive devices. Substrate 144 can also be a multi-layer flexible laminate, ceramic, or leadframe. Substrate 144 is mounted to interface layer 142 over carrier 140.

In FIG. 4b, a plurality of vias is formed through substrate 144 using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect conductive vias 146.

An insulating or passivation layer 148 is formed over a surface of substrate 144 and conductive vias 146 using PVD, CVD, printing, spin coating, spray coating, sintering or thermal oxidation. The insulating layer 148 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. A portion of insulating layer 148 is removed by an etching process to expose substrate 144 and conductive vias 146.

An electrically conductive layer or RDL 150 is formed over the exposed substrate 144 and conductive vias 146 using a patterning and metal deposition process such as printing, PVD, CVD, sputtering, electrolytic plating, and electroless plating. Conductive layer 150 can be one or more layers of Al, Cu, Sn, Ni, Au, Ag, or other suitable electrically conductive material. Conductive layer 150 is electrically connected to conductive vias 146.

In FIG. 4c, a substrate or carrier 154 contains temporary or sacrificial base material such as silicon, polymer, beryllium oxide, or other suitable low-cost, rigid material for structural support. An interface layer or double-sided tape 156 is formed over carrier 154 as a temporary adhesive bonding film or etch-stop layer. Leading with insulating layer 148 and conductive layer 150, substrate 144 is mounted to interface layer 156 over carrier 154. Carrier 140 and interface layer 142 are removed by chemical etching, mechanical peeling, CMP, mechanical grinding, thermal bake, UV light, laser scanning, or wet stripping to expose a surface of substrate 144 and conductive vias 146 opposite conductive layer 150.

An insulating or passivation layer 158 is formed over substrate 144 and conductive vias 146 using PVD, CVD, printing, spin coating, spray coating, sintering or thermal oxidation. The insulating layer 158 contains one or more layers of $SiO_2$, $Si_3N_4$, SiON, $Ta_2O_5$, $Al_2O_3$, or other material having similar insulating and structural properties. A portion of insulating layer 158 is removed by an etching process to expose substrate 144 and conductive vias 146.

An electrically conductive layer or RDL 160 is formed over the exposed substrate 144 and conductive vias 146 using a patterning and metal deposition process such as printing, PVD, CVD, sputtering, electrolytic plating, and electroless plating. Conductive layer 160 can be one or more layers of Al, Cu, Sn, Ni, Au, Ag, or other suitable electrically conductive material. Conductive layer 160 is electrically connected to conductive vias 146. In another embodiment, conductive vias 146 are formed through substrate 144 after forming conductive layers 150 and/or 160. Carrier 154 and interface layer 156 are removed by chemical etching, mechanical peeling, CMP, mechanical grinding, thermal bake, UV light, laser scanning, or wet stripping to expose a surface of substrate 144, including insulating layer 148 and conductive layer 160.

The interposer or substrate 162 shown in FIG. 4d provides electrical interconnect vertically and laterally across the interposer through conductive layers 150 and 160 and conductive vias 146 according to the electrical function of semiconductor die 124. A top surface of interposer 162 has a die attach area 166 designated for mounting semiconductor die 124 and leadframe attach area 168 designed as mounting point for leadframe 170. The die attach area 166 is generally located within an interior space of interposer 162. Leadframe attach area 168 is located around die attach area 166, outside a footprint of the later-mounted semiconductor die 124.

In FIG. 4e, semiconductor die 124 from FIGS. 3a-3c is aligned to die attach area 166 and mounted to interposer 162 by reflowing bumps 134 to metallurgically and electrically connect the bumps to conductive layer 150. Alternatively, a package-on-package (PoP) semiconductor device can be mounted to die attach area 166 of interposer 162. FIG. 4f shows semiconductor die 124 mounted to die attach area 166 of interposer 162. Bumps 134 are electrically connected to conductive layers 150 and 160 and conductive vias 146 in accordance with the electrical design and function of semiconductor die 124.

FIG. 4g shows a portion of wafer-form or strip form leadframe 170 having a base plate or die mounting site 172 and a plurality of tie bars 174 arranged in rows and a plurality of conductive bodies 176 integrated with the tie bars. FIG. 4h shows a top view of leadframe 170 with multiple rows of integrated tie bars 174 and conductive bodies 176 around base plates 172. FIG. 4i shows a top view of another embodiment of leadframe 170 with multiple rows of integrated tie bars 174 and offset conductive bodies 176 around base plates 172. In one embodiment, leadframe 170 is an un-singulated, preformed, laminated substrate made with leadframe manufacturing techniques, such as stamping or etching into a single integrated structure. Leadframe 170 can be a pre-plated leadframe (PPF). Leadframe 170 can be gold, silver, nickel, platinum, copper, copper alloys (including one or more elements of nickel, iron, zinc, tin, chromium, silver, and phosphorous), or other suitable materials. Leadframe 170 provides structural support and electrical interconnection for semiconductor die 124.

Tie bars 174 are formed with a down step 178 having slanted or angled surface 178a and horizontal surface 178b, as shown in FIG. 4g. Alternatively, down step 178 has a vertical surface and horizontal surface, or down step 178 can have angled surfaces 178a without horizontal surface 178b, i.e. a "V" shape. In one embodiment, the depth of down step 178 is 50-100 micrometers (μm) and the width of tie bars 174, i.e., between conductive bodies 176, is 50-100 μm. The height of conductive bodies 176 is 50-100 μm. The horizontal portion 178b of tie bars 174 will be removed in a subsequent manufacturing step to electrically isolate conductive bodies 176, e.g., before electrical testing.

Leading with conductive bodies 176, leadframe 170 is aligned with base plate 172 positioned over back surface 128 of semiconductor die 124 and the conductive bodies positioned over leadframe attach area 168. FIG. 4j shows leadframe 170 mounted to semiconductor die 124 and interposer 162 and secured in place with base plate 172 adhering to adhesive layer 180 over back surface 128 of semiconductor die 124 and conductive bodies 176 adhering to conductive paste or adhesive beads 182 over conductive layer 150 of interposer 162.

In FIG. 4k, an encapsulant or molding compound 184 is deposited over semiconductor die 124, interposer 162, and into down step 178 of integrated leadframe 170 using a paste printing, compressive molding, transfer molding, liquid encapsulant molding, vacuum lamination, spin coating, or other suitable applicator. Encapsulant 184 contacts the angled portion 178a and horizontal portion 178b of down step 178. Encapsulant 184 can be polymer composite material, such as epoxy resin with filler, epoxy acrylate with filler, or polymer with proper filler. In another embodiment, a film assist mold (FAM) can be applied over semiconductor die 124, interposer 162, and down step 178 of integrated leadframe 170, while leaving base plate 172 and conductive bodies 176 exposed. The viscosity of encapsulant 184 is selected for uniform coverage, e.g., a lower viscosity increases the flow of the encapsulant. Encapsulant 184 is non-conductive and environmentally protects the semiconductor device from external elements and contaminants. A back surface of leadframe 170 and encapsulant 184 can be planarized by backgrinding or CMP to remove excess encapsulant from base plate 172 and conductive bodies 176. Accordingly, base plate 172 and a portion of conductive bodies 176 are exposed from encapsulant 184.

In FIG. 4l, an optional electrically conductive layer 186 is formed over the exposed portion conductive bodies 176 using a patterning and metal deposition process such as printing, PVD, CVD, sputtering, electrolytic plating, and electroless plating. Conductive layer 186 can be one or more layers of Al, Cu, Sn, Ni, Au, Ag, or other suitable electrically conductive material. Conductive layer 186 operates as a plating layer over the exposed conductive bodies 176 to reduce oxidation. Conductive layer 186 is electrically connected to conductive bodies 176.

In FIG. 4m, leadframe 170 is singulated through encapsulant 184 in down step 178 and further through horizontal surface 178b of tie bars 174 with saw blade or laser cutting tool 188. Leadframe 170 can be singulated by an etching process. The singulation extends completely through tie bars 174 and partially into encapsulant 184 below the tie bars, i.e., to sufficient depth to completely sever the tie bars. Conductive bodies 176 are electrically isolated by the singulation to form conductive pillars or vias 190 embedded within encapsulant 184 and electrically connected to conductive layer 150 of interposer 162. Tie bars 174 extend to an edge of encapsulant 184 due to the singulation. Base plate 172 of leadframe 170 disposed on back surface 128 of semiconductor die 124 can function as a heat spreader to dissipate thermal energy, or as a shielding layer to reduce the effects of EMI and RFI.

In FIG. 4n, an electrically conductive bump material is deposited over conductive layer 160 of interposer 162 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 192. In some applications, bumps 192 are reflowed a second time to improve electrical contact to conductive layer 160. An under bump metallization (UBM) layer can be formed under bumps 192. Bumps 192 can also be compression bonded to conductive layer 160. Bumps 192 represent one type of interconnect structure that can be formed over conductive layer 160. The interconnect structure can also be stud bumps, micro bumps, or other electrical interconnect. Bumps 192 can be formed prior to leadframe singulation.

Semiconductor die 124 is electrically connected to conductive layers 150 and 160, conductive vias 146, and bumps 134 and 192 for bottom-side electrical interconnect of Fo-WLCSP 194. Semiconductor die 124 is also electrically connected to conductive pillars 190 and conductive layer 186 for topside electrical interconnect of Fo-WLCSP 194. Leadframe 170 reduces warpage and increases vertical electrical interconnect capacity for semiconductor die 124. Encapsulant 184 disposed within down step 178 reduces defects from electrical shorts.

Figure 5A:
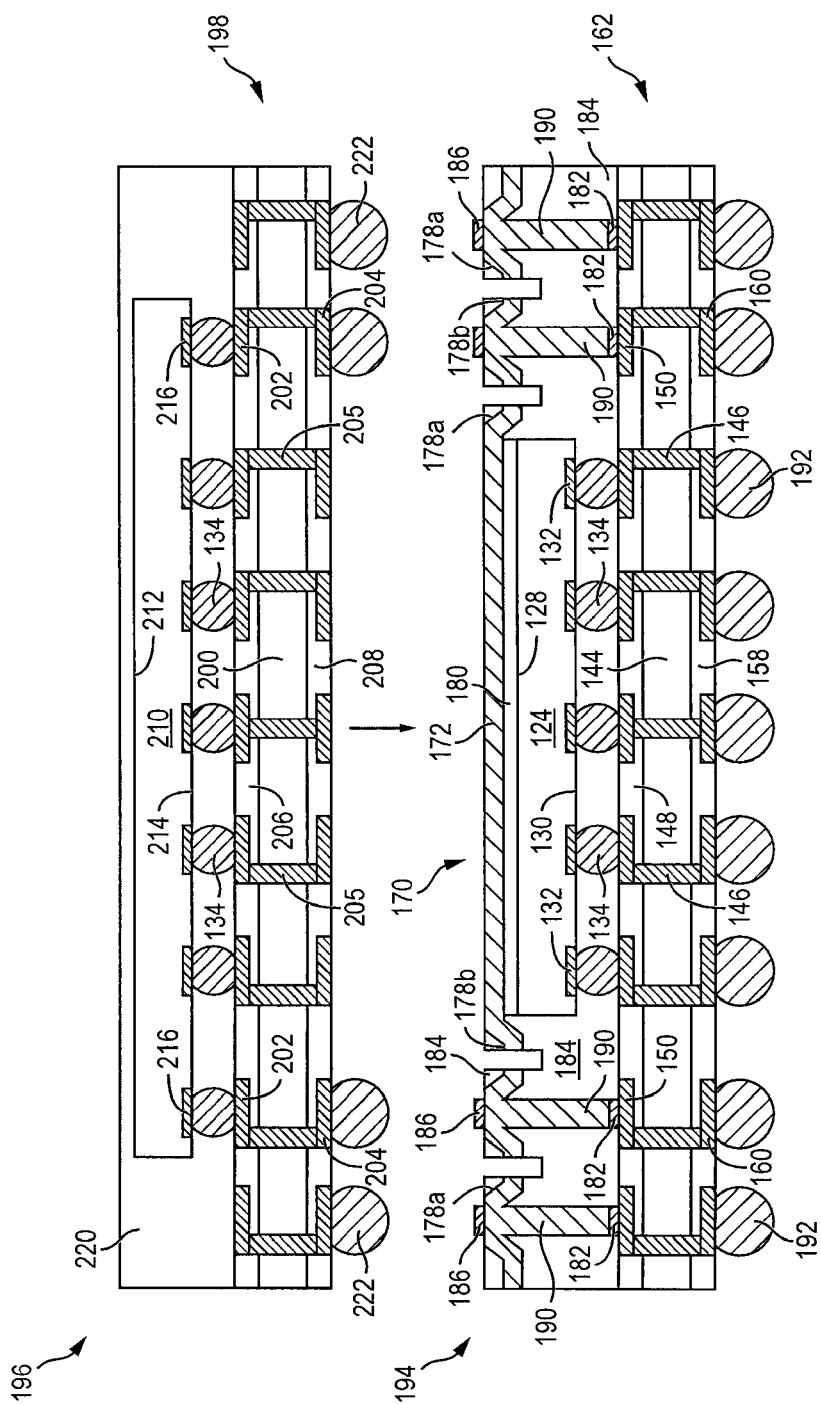
FIGS. 5a-5b illustrate a semiconductor package stacked over the leadframe and semiconductor die.
Figure 5B:
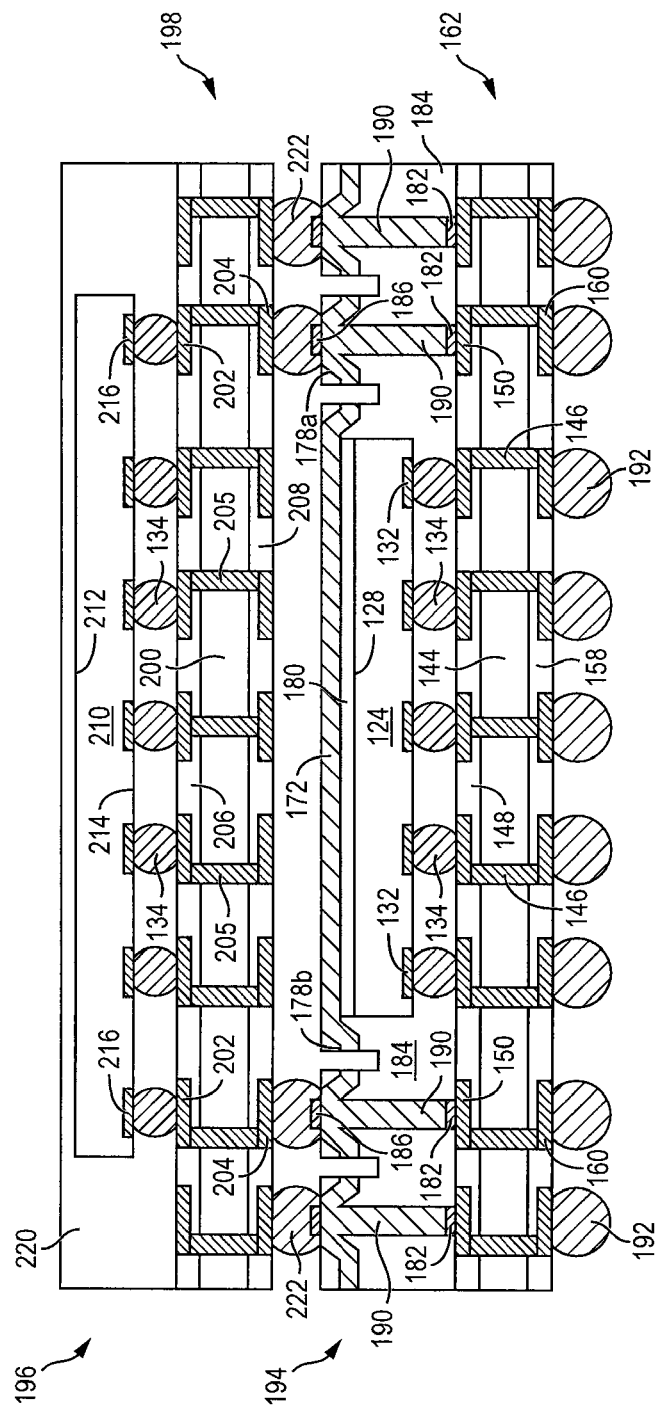

FIGS. 5a-5b illustrate a semiconductor package 196 mounted to Fo-WLCSP 194. In FIG. 5a, semiconductor package 196 includes an interposer 198 with semiconductor wafer or substrate 200, conductive layers 202 and 204, conductive vias 205, and insulating layers 206 and 208, similar to interposer 162 in FIGS. 4a-4d. A semiconductor die 210 originating from a semiconductor wafer, similar to FIG. 3a, has a back surface 212 and active surface 214 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 214 to implement analog circuits or digital circuits, such as DSP, ASIC, memory, or other signal processing circuit. Semiconductor die 210 may also contain IPDs, such as inductors, capacitors, and resistors, for RF signal processing. In one embodiment, semiconductor die 210 is a flipchip type semiconductor die. A plurality of contact pads 216 is formed on active surface 214 and electrically connected to the circuits on the active surface. A plurality of bumps 218 is formed over contact pads 216.

Semiconductor die 210 is mounted to interposer 198 with active surface 214 oriented toward the interposer and bumps 218 aligned with conductive layer 202. Bumps 218 are reflowed to metallurgically and electrically connect semiconductor die 210 to interposer 198.

An encapsulant or molding compound 220 is deposited over semiconductor die 210 and interposer 198 using a paste printing, compressive molding, transfer molding, liquid encapsulant molding, vacuum lamination, spin coating, or other suitable applicator. Encapsulant 220 can be polymer composite material, such as epoxy resin with filler, epoxy acrylate with filler, or polymer with proper filler. Encapsulant 220 is non-conductive and environmentally protects the semiconductor device from external elements and contaminants.

A plurality of bumps 222 is formed over conductive layer 204 of interposer 198. Semiconductor package 196 is positioned over Fo-WLCSP 194 with bumps 222 aligned to conductive layer 186 over conductive pillars 190. FIG. 5b shows semiconductor package 196 mounted to Fo-WLCSP 194. Bumps 222 are reflowed over conductive layer 186 to metallurgically and electrically connect semiconductor package 196 to Fo-WLCSP 194.

Figure 6A:
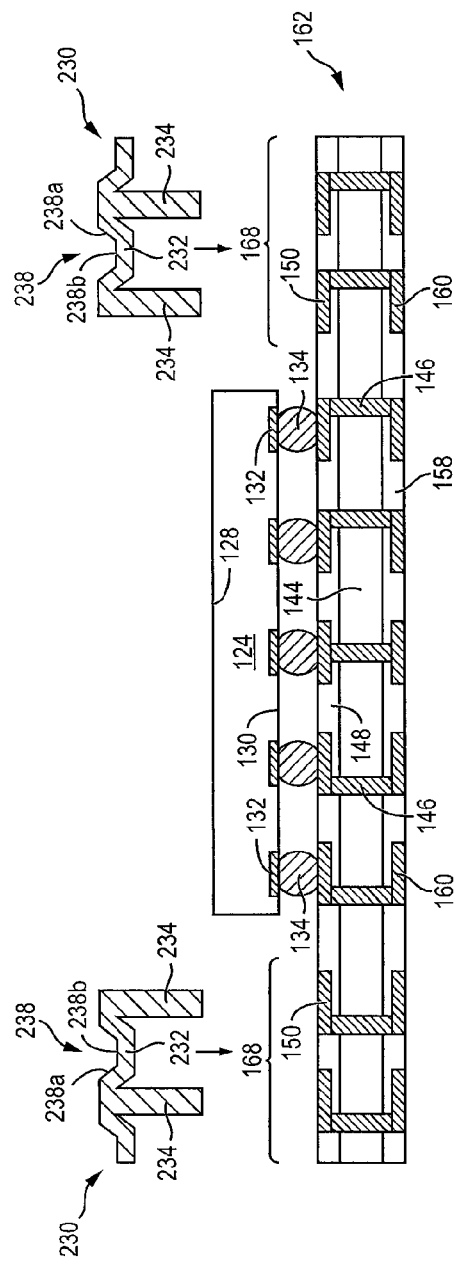

FIGS. 6a-6g illustrate, in relation to FIGS. 1 and 2a-2c, a process of forming a leadframe with conductive bodies for vertical electrical interconnect of a semiconductor die. Continuing from FIG. 4f, a wafer-form or strip form leadframe 230 includes a plurality of tie bars 232 arranged in rows and a plurality of conductive bodies 234 integrated with the tie bars, as shown in FIG. 6a. In one embodiment, leadframe 230 is an un-singulated, pre-formed, laminated substrate made with leadframe manufacturing techniques, such as stamping or etching into a single integrated structure. Leadframe 230 can be a PPF. Leadframe 230 can be gold, silver, nickel, platinum, copper, copper alloys (including one or more elements of nickel, iron, zinc, tin, chromium, silver, and phosphorous), or other suitable materials. Leadframe 230 provides structural support and electrical interconnection for semiconductor die 124.

Tie bars 232 are formed with a down step 238 having slanted or angled surface 238a and horizontal surface 238b. Alternatively, down step 238 has a vertical surface and horizontal surface, or down step 238 can have angled surfaces 238a without horizontal surface 238b, i.e. a "V" shape. In one embodiment, the depth of down step 238 is 50-100 μm, and the width of tie bars 232, i.e., between conductive bodies 234, is 50-100 μm. The height of conductive bodies 234 is 50-100 μm. The horizontal portion 238b of tie bars 232 will be removed in a subsequent manufacturing step to electrically isolate conductive bodies 234, e.g., before electrical testing.

Figure 6B:
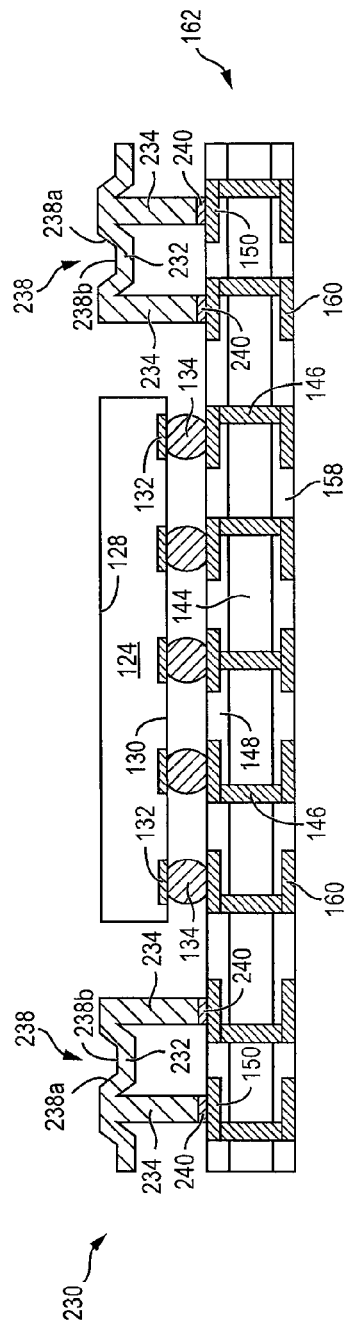

Leading with conductive bodies 234, leadframe 230 is aligned with the conductive bodies positioned over leadframe attach area 168. FIG. 6b shows leadframe 230 mounted to semiconductor die 124 and interposer 162 and secured in place with conductive bodies 234 adhering to conductive paste or adhesive beads 240 over conductive layer 150 of interposer 162. FIG. 6c shows a top view of leadframe 230 with rows of integrated tie bars 232 and conductive bodies 234 mounted over interposer 162 and around semiconductor die 124.

In FIG. 6d, an encapsulant or molding compound 242 is deposited over semiconductor die 124, interposer 162, and into down step 238 of integrated leadframe 230 using a paste printing, compressive molding, transfer molding, liquid encapsulant molding, vacuum lamination, spin coating, or other suitable applicator. Encapsulant 242 contacts the angled portion 238a and horizontal portion 238b of down step 238. Encapsulant 242 can be polymer composite material, such as epoxy resin with filler, epoxy acrylate with filler, or polymer with proper filler. In another embodiment, a FAM can be applied over semiconductor die 124, interposer 162, and down step 238 of integrated leadframe 230, while leaving conductive bodies 234 exposed. The viscosity of encapsulant 242 is selected for uniform coverage, e.g., a lower viscosity increases the flow of the encapsulant. Encapsulant 242 is non-conductive and environmentally protects the semiconductor device from external elements and contaminants. A back surface of leadframe 230 and encapsulant 242 can be planarized by backgrinding or CMP to remove excess encapsulant from conductive bodies 234. Accordingly, a portion of conductive bodies 234 is exposed from encapsulant 242.

Figure 6E:
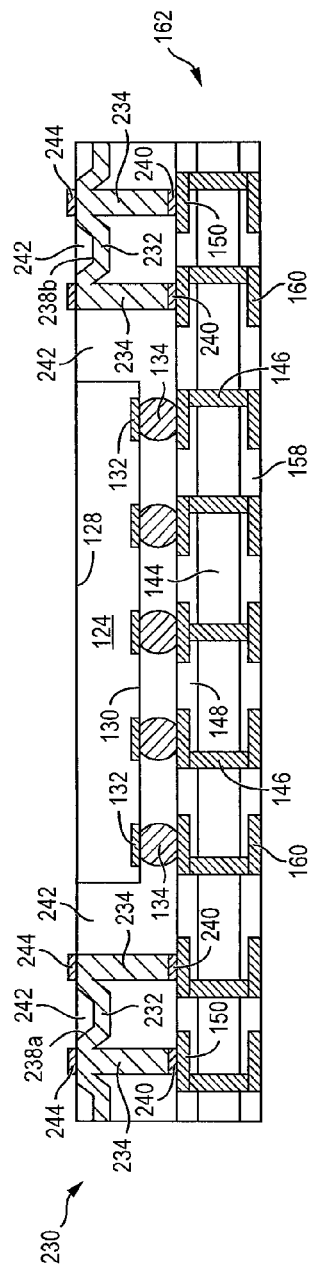

In FIG. 6e, an optional electrically conductive layer 244 is formed over the exposed portion conductive bodies 234 using a patterning and metal deposition process such as printing, PVD, CVD, sputtering, electrolytic plating, and electroless plating. Conductive layer 244 can be one or more layers of Al, Cu, Sn, Ni, Au, Ag, or other suitable electrically conductive material. Conductive layer 244 operates as a plating layer over the exposed conductive bodies 234 to reduce oxidation. Conductive layer 244 is electrically connected to conductive bodies 234.

Figure 6F:
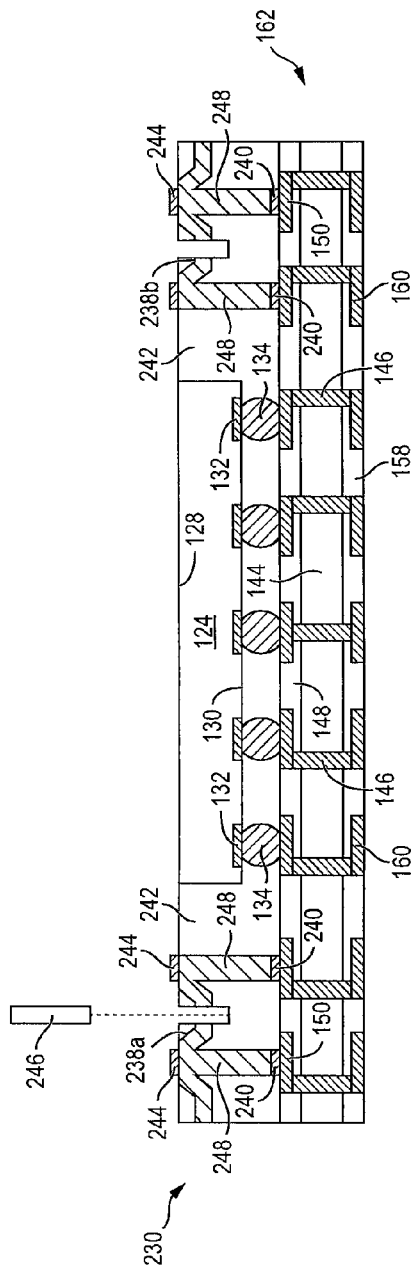

In FIG. 6f, leadframe 230 is singulated through encapsulant 242 in down step 238 and further through horizontal surface 238b of tie bars 232 with saw blade or laser cutting tool 246. Leadframe 230 can be singulated by etching process. The singulation extends completely through tie bars 232 and partially into encapsulant 242 below the tie bars, i.e., to sufficient depth to completely sever the tie bars. Other tie bars 232 in FIG. 6c are also singulated to electrically isolate conductive bodies 234 as conductive pillars or vias 248 embedded within encapsulant 242 and electrically connected to conductive layer 150 of interposer 162. Tie bars 232 extend to an edge of encapsulant 242 due to the singulation.

Figure 6G:
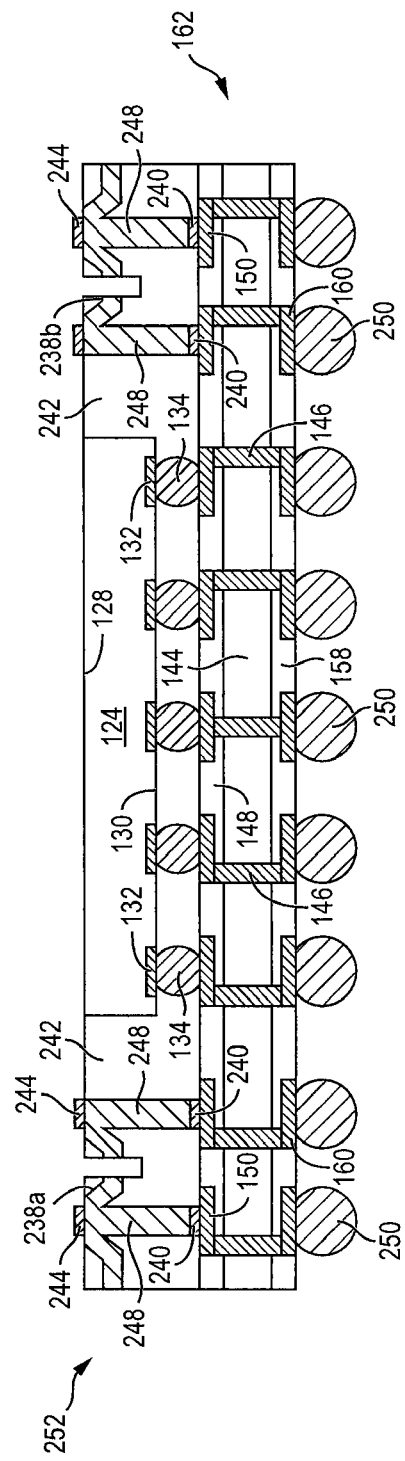

In FIG. 6g, an electrically conductive bump material is deposited over conductive layer 160 of interposer 162 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 250. In some applications, bumps 250 are reflowed a second time to improve electrical contact to conductive layer 160. A UBM layer can be formed under bumps 250. Bumps 250 can also be compression bonded to conductive layer 160. Bumps 250 represent one type of interconnect structure that can be formed over conductive layer 160. The interconnect structure can also be stud bumps, micro bumps, or other electrical interconnect. Bumps 250 can be formed prior to leadframe singulation.

Semiconductor die 124 is electrically connected to conductive layers 150 and 160, conductive vias 146, and bumps 134 and 250 for bottom-side electrical interconnect of Fo-WLCSP 252. Semiconductor die 124 is also electrically connected to conductive pillars 248 for topside electrical interconnect of Fo-WLCSP 252. Leadframe 230 reduces warpage and increases vertical electrical interconnect capacity for semiconductor die 124. Encapsulant 242 disposed within down step 238 reduces defects from electrical shorts.

Figure 7C:
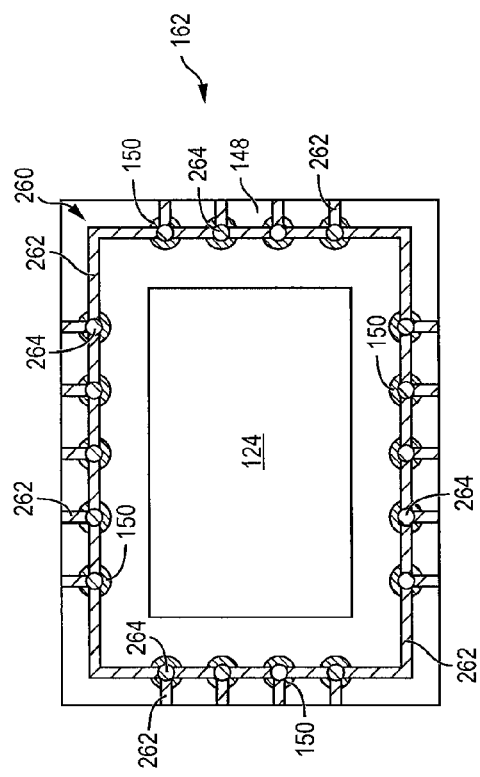

FIGS. 7a-7f illustrate, in relation to FIGS. 1 and 2a-2c, a process of forming a leadframe with a single row of conductive bodies for vertical electrical interconnect of a semiconductor die. Continuing from FIG. 4f, a wafer-form or strip form leadframe 260 includes a plurality of tie bars 262 arranged in rows and a plurality of conductive bodies 264 integrated with the tie bars, as shown in FIG. 7a. In one embodiment, leadframe 260 is an un-singulated, pre-formed, laminated substrate made with leadframe manufacturing techniques, such as stamping or etching into a single integrated structure. Leadframe 260 can be a PPF. Leadframe 260 can be gold, silver, nickel, platinum, copper, copper alloys (including one or more elements of nickel, iron, zinc, tin, chromium, silver, and phosphorous), or other suitable materials. Leadframe 260 provides structural support and electrical interconnection for semiconductor die 124.

Tie bars 262 are formed with a down step 268 having slanted or angled surface 268a and horizontal surface 268b. Alternatively, down step 268 has a vertical surface and horizontal surface, or down step 268 can have angled surface 268a without horizontal surface 268b. In one embodiment, the depth of down step 268 is 50-100 µm, and the height of conductive bodies 264 is 50-100 µm. A portion tie bars 262 will be removed in a subsequent manufacturing step to electrically isolate conductive bodies 264, e.g., before electrical testing.

Leading with conductive bodies 264, leadframe 260 is aligned with the conductive bodies positioned over leadframe attach area 168. FIG. 7b shows leadframe 260 mounted to semiconductor die 124 and interposer 162 and secured in place with conductive bodies 264 adhering to conductive paste or adhesive beads 270 over conductive layer 150 of interposer 162. FIG. 7c shows a top view of leadframe 260 with integrated tie bars 262 and conductive bodies 264 mounted over semiconductor die 124 and interposer 162.

Figure 7D:
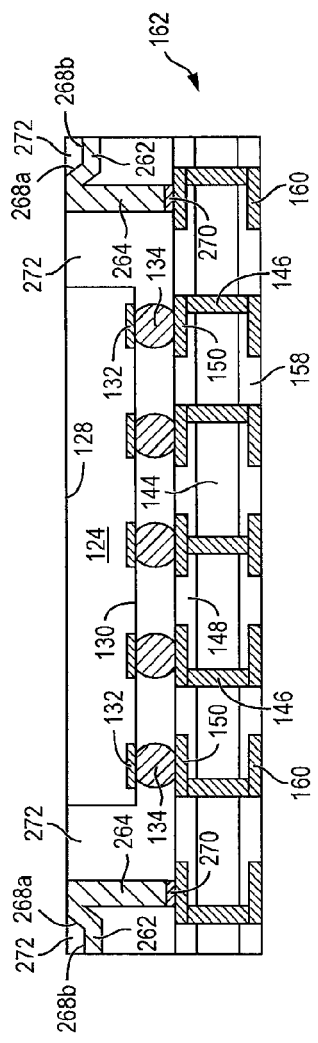

In FIG. 7d, an encapsulant or molding compound 272 is deposited over semiconductor die 124, interposer 162, and into down step 268 of integrated leadframe 260 using a paste printing, compressive molding, transfer molding, liquid encapsulant molding, vacuum lamination, spin coating, or other suitable applicator. Encapsulant 272 contacts the angled portion 268a and horizontal portion 268b of down step 268. Encapsulant 272 can be polymer composite material, such as epoxy resin with filler, epoxy acrylate with filler, or polymer with proper filler. In another embodiment, a FAM can be applied over semiconductor die 124, interposer 162, and down step 268 of integrated leadframe 260, while leaving conductive bodies 264 exposed. The viscosity of encapsulant 272 is selected for uniform coverage, e.g., a lower viscosity increases the flow of the encapsulant. Encapsulant 272 is non-conductive and environmentally protects the semiconductor device from external elements and contaminants. A back surface of leadframe 260 and encapsulant 272 can be planarized by backgrinding or CMP to remove excess encapsulant from conductive bodies 264. Accordingly, a portion of conductive bodies 264 is exposed from encapsulant 272.

In FIG. 7e, an optional electrically conductive layer 274 is formed over the exposed portion conductive bodies 264 using a patterning and metal deposition process such as printing, PVD, CVD, sputtering, electrolytic plating, and electroless plating. Conductive layer 274 can be one or more layers of Al, Cu, Sn, Ni, Au, Ag, or other suitable electrically conductive material. Conductive layer 274 operates as a plating layer over the exposed conductive bodies 264 to reduce oxidation. Conductive layer 274 is electrically connected to conductive bodies 264.

Leadframe 260 is singulated through encapsulant 272 in down step 268 and further through horizontal surface 268b of tie bars 262 with a saw blade or laser cutting tool. Leadframe 260 can be singulated by etching process. The singulation extends completely through tie bars 262 and partially into encapsulant 272 below the tie bars, i.e., to sufficient depth to completely sever the tie bars and electrically isolate conductive bodies 264 as conductive pillars or vias 276 embedded within encapsulant 272 and electrically connected to conductive layer 150 of interposer 162. Tie bars 262 extend to an edge of encapsulant 272 due to the singulation.

In FIG. 7f, an electrically conductive bump material is deposited over conductive layer 160 of interposer 162 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 278. In some applications, bumps 278 are reflowed a second time to improve electrical contact to conductive layer 160. A UBM layer can be formed under bumps 278. Bumps 278 can also be compression bonded to conductive layer 160. Bumps 278 represent one type of interconnect structure that can be formed over conductive layer 160. The interconnect structure can also be stud bumps, micro bumps, or other electrical interconnect. Bumps 278 can be formed prior to leadframe singulation.

Semiconductor die 124 is electrically connected to conductive layers 150 and 160, conductive vias 146, and bumps 134 and 278 for bottom-side electrical interconnect of Fo-WLCSP 280. Semiconductor die 124 is also electrically connected to conductive pillars 276 for topside electrical interconnect of Fo-WLCSP 280. Leadframe 260 reduces warpage and increases vertical electrical interconnect capacity for semiconductor die 124. Encapsulant 272 disposed within down step 268 reduces defects from electrical shorts.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first substrate;
   disposing a first semiconductor die over the first substrate;
   providing a leadframe including a base plate and a plurality of tie bars and conductive bodies, the tie bars including a down step with a slanted surface and a horizontal surface between the conductive bodies;
   disposing the leadframe over the first semiconductor die and first substrate with the base plate disposed over a non-active surface of the first semiconductor die and the conductive bodies disposed adjacent to the first semiconductor die and electrically connected to the first substrate;
   depositing an encapsulant over the first substrate and around the first semiconductor die and into the down step of the tie bars; and
   forming a recess in the encapsulant and extending through the tie bars to electrically isolate the conductive bodies from the base plate.

2. The method of claim 1, further including forming the recess through the horizontal surface of the tie bars to electrically isolate the conductive bodies from the base plate.

3. The method of claim 1, further including:
   providing a second substrate;
   disposing a second semiconductor die over the second substrate; and
   disposing the second substrate and second semiconductor die over the first substrate and first semiconductor die.

4. The method of claim 3, further including:
   forming an interconnect structure over the second substrate; and
   bonding the interconnect structure to the conductive bodies.

5. The method of claim 1, further including forming a conductive layer over the conductive bodies.

6. The method of claim 1, wherein the conductive bodies are offset within the tie bars.

7. A method of making a semiconductor device, comprising:
   providing a first substrate;
   disposing a first semiconductor die over the first substrate;
   providing a leadframe including a plurality of tie bars and conductive bodies, the tie bars including a down step between the conductive bodies;
   disposing the leadframe over the first semiconductor die and first substrate with the conductive bodies disposed adjacent to the first semiconductor die and electrically connected to the first substrate;
   depositing an encapsulant over the first substrate and around the first semiconductor die and into the down step of the tie bars;
   forming a recess partially through the encapsulant and through the tie bars to electrically isolate the conductive bodies; and
   singulating through the leadframe with the recess remaining after singulation.

8. The method of claim 7, wherein the down step of the tie bars includes an angled surface and horizontal surface.

9. The method of claim 7, wherein the leadframe includes a base plate.

10. The method of claim 7, further including:
    providing a second substrate;
    disposing a second semiconductor die over the second substrate; and
    disposing the second substrate and second semiconductor die over the first substrate and first semiconductor die.

11. The method of claim 10, further including:
    forming an interconnect structure over the second substrate; and
    bonding the interconnect structure to the conductive bodies.

12. The method of claim 7, further including forming a conductive layer over the conductive bodies.

13. The method of claim 7, wherein the conductive bodies are offset within the tie bars.

14. A method of making a semiconductor device, comprising:
    providing a first semiconductor die;
    providing a leadframe including a plurality of tie bars and conductive bodies;
    disposing the leadframe over the first semiconductor die with the conductive bodies disposed adjacent to the first semiconductor die;
    depositing an encapsulant over the first semiconductor die;
    forming a recess in the encapsulant and extending through the tie bars; and
    singulating through the encapsulant with the recess remaining after singulation.

15. The method of claim 14, wherein the tie bars include a down step between the conductive bodies and the down step of the tie bars includes an angled surface and horizontal surface.

16. The method of claim 14, wherein the leadframe includes a base plate.

17. The method of claim 14, further including:
    providing a first substrate;
    disposing the first semiconductor die over the first substrate; and
    disposing the leadframe over the first semiconductor die and first substrate.

18. The method of claim 17, further including:
    providing a second substrate;
    disposing a second semiconductor die over the second substrate; and
    disposing the second substrate and second semiconductor die over the first substrate and first semiconductor die.

19. The method of claim 14, further including forming a conductive layer over the conductive bodies.

20. The method of claim 14, further including planarizing the encapsulant to expose the conductive bodies from the encapsulant.

* * * * *